United States Patent
Lee et al.

(10) Patent No.: US 7,443,756 B2
(45) Date of Patent: Oct. 28, 2008

(54) MEMORY DEVICE HAVING REDUNDANCY FUSE BLOCKS ARRANGED FOR TESTING

(75) Inventors: Yu-Lim Lee, Gyeonggi-do (KR);
Sung-Hoon Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 11/565,821

(22) Filed: Dec. 1, 2006

(65) Prior Publication Data
US 2007/0177441 A1 Aug. 2, 2007

(30) Foreign Application Priority Data
Feb. 1, 2006 (KR) .................. 10-2006-0009806

(51) Int. Cl.
*G11C 17/18* (2006.01)
(52) U.S. Cl. .................. 365/225.7; 365/200; 365/63
(58) Field of Classification Search .............. 365/225.7, 365/200, 63
See application file for complete search history.

(56) References Cited

U.S. PATENT DOCUMENTS

| | | | |
|---|---|---|---|
| 5,636,172 A * | 6/1997 | Prall et al. ............... | 365/225.7 |
| 6,314,032 B2 | 11/2001 | Takase | |
| 6,388,941 B2 | 5/2002 | Otori et al. | |
| 6,407,950 B2 * | 6/2002 | Ooishi ................... | 365/189.14 |
| 6,834,016 B2 * | 12/2004 | Kato et al. .................. | 365/200 |
| 2005/0002243 A1 * | 1/2005 | Mohr et al. ................. | 365/200 |
| 2006/0039210 A1 * | 2/2006 | Blodgett .................... | 365/200 |

FOREIGN PATENT DOCUMENTS

KR 1999-000470 1/1999

OTHER PUBLICATIONS

English language abstract for Korean Publication No. 1999-000470.

* cited by examiner

*Primary Examiner*—Tuan T. Nguyen
(74) *Attorney, Agent, or Firm*—Marger Johnson & McCollom, P.C.

(57) ABSTRACT

A method of arranging redundancy fuse block arrays may reduce test time for a memory device. The memory device may include a stack bank structure in which at least two banks share a row decoder or a column decoder. Redundancy fuse block arrays for the two banks may be alternately arranged in an X-axis direction or a Y-axis direction of a wafer. Accordingly, a tester may repair defective rows or columns of the two banks without shifting from one axis.

20 Claims, 2 Drawing Sheets

MEMORY DEVICE HAVING REDUNDANCY FUSE BLOCKS ARRANGED FOR TESTING

CROSS-REFERENCE TO RELATED APPLICATION

This application claims priority from Korean Patent Application No. 10-2006-0009806, filed on Feb. 1, 2006, in the Korean Intellectual Property Office, the disclosure of which is incorporated herein in its entirety by reference.

BACKGROUND

1. Field of Invention

The inventive principles of this patent disclosure relates to a semiconductor memory device, and more particularly, to methods and apparatus in which redundancy fuse block arrays are arranged to accommodate testing of the memory device.

2. Description of the Related Art

Semiconductor memory devices have increasingly become faster and more highly integrated with the development of precision technology. In particular, semiconductor memory devices require high yields in addition to high integration. A semiconductor memory device includes numerous memory cells. Even a single defective memory cell can hinder the semiconductor memory device from operating properly.

As semiconductor memory devices become more highly integrated, memory cells included therein are more likely to be defective. Generally, defects are found in a small number of memory cells. Defective memory cells are a major cause of reduced yields since they interfere with the functions of semiconductor memory devices. Therefore, redundant circuit technology is widely used to increase yields in semiconductor memory devices. Redundant circuit technology enables detection and replacement of defective memory cells with spare (redundant) memory cells during testing to enhance yields of semiconductor memory devices.

In general, a redundancy circuit drives a redundancy memory cell block in which spare rows and columns of redundancy memory cells are arranged. The redundancy circuit selects a row or column of redundancy memory cells within the redundancy memory cell block to replace a row or column of memory cells having one or more defective memory cells. The redundancy circuit selects a row or column of redundancy memory cells in response to an address signal designating a row or column of memory cells including the defective memory cells. To this end, the redundancy circuit includes a fuse block array in which a plurality of fuses are arranged. The fuses are programmed such that fuses corresponding to a defective row address or defective column address are cut or burned to open the fuses.

FIG. 1 is a block diagram of a conventional memory device 100 including a plurality of redundancy fuse block arrays 151 through 158. Referring to FIG. 1, the memory device 100 includes an A bank 110, a B bank 120, a C bank 130, and a D bank 140. The A bank 110 and the B bank 120 have a stack bank structure for sharing a first row decoder 150. Alternatively, the A bank 110 and the B bank 120 may have a stack bank structure for sharing a column decoder (not shown). The A bank 110 and the B bank 120 memory cells are addressed using the shared row decoder 150 or the column decoder. The C bank 130 and the D bank 140 also have a stack bank structure for sharing a second row decoder 160.

The redundancy fuse block arrays 151 through 158 for repairing defective rows of the A bank 110 and the B bank 120 with redundancy rows are arranged in the first row decoder 150. The redundancy fuse block arrays 151 through 158 may be used to repair defective columns of the A bank 110 and the B bank 120 with redundancy columns.

The redundancy fuse block arrays 151 through 154 for the A bank 110 are arranged adjacent to the A bank 110, and the redundancy fuse block arrays 155 through 158 for the B bank 120 are arranged adjacent to the B bank 120. Similarly, redundancy fuse block arrays for the C bank 130 are arranged adjacent to the C bank 130, and redundancy fuse block arrays for the D bank 140 are arranged adjacent to the D bank 140 in the second row decoder 160.

When the memory device 100 is tested to repair defective rows, a tester programs the redundancy fuse block arrays 151 through 154 for the A bank 110 to replace defective rows of the A bank 110 with redundancy rows while moving in a first direction, for example, an X-axis direction, of the memory device 100. Then, the tester programs the redundancy fuse block arrays 155 through 158 for the B bank 120 to replace defective rows of the B bank 120 with redundancy rows while moving in a Y-axis direction and then the X-axis direction of the memory device 100.

If few defective rows are found in the A bank 110 or the B bank 120, then not all of the redundancy fuse block arrays 151 through 154 for the A bank 110 are required to repair defective rows of the A bank 110. Generally, one or two of the four redundancy fuse block arrays 151 through 154 for the A bank 110 are used to repair the defective rows of the A bank 110. Similarly, if few defective rows are found in the B bank 120, then not all of the redundancy fuse block arrays 155 through 158 for the B bank 120 are required to repair defective rows of the B bank 120.

However, the tester passes all the redundancy fuse block arrays 151 through 154 for the A bank 110 while moving in the X-axis direction of the memory device 100 to repair the defective rows of the A bank 110 and then passes all the redundancy fuse bock arrays 155 through 158 for the B bank 120 while moving in the Y-axis direction and then in the X-axis direction of the memory device 100 to repair the defective rows of the B bank 120.

Accordingly, even when there is no need to repair many defective rows of the A bank 110, the tester wastes time passing all of the redundancy fuse block arrays 151 through 154 for the A bank 110 included in the memory device 100. In addition, since the tester shifts from the X-axis direction, to the Y-axis direction, and then to the X-axis direction of the memory device 100, a longer test time is required.

SUMMARY

According to some of the inventive principles of this patent disclosure, a memory device may include: a first bank comprising first rows and first columns of a plurality of first memory cells; a second bank comprising second rows and second columns of a plurality of second memory cells; a redundancy cell block in which a plurality of redundancy cells are arranged; a decoder shared by the first and second banks to address the first and second memory cells; redundancy fuse blocks for the first bank included in the decoder to repair a defective one of the first memory cells with a first corresponding redundancy cell; and redundancy fuse blocks for the second bank included in the decoder and repair a defective one of the second memory cells with a second corresponding redundancy cell; wherein the redundancy fuse blocks for the first bank and the redundancy fuse blocks for the second bank are alternately arranged in the decoder. The decoder may be a row decoder or a column decoder.

The redundancy fuse blocks for the first bank and the redundancy fuse blocks for the second bank may be alternately arranged in an X direction of a wafer in which the memory device is integrated. At least two rows of the redundancy fuse blocks for the first bank and the redundancy fuse blocks for the second banks may be alternately arranged.

The redundancy fuse blocks for the first bank and the redundancy fuse blocks for the second bank may repair a row of the first or second memory cells including the defective cell with a row of redundancy cells including the first and second corresponding redundancy cells.

Alternatively, the redundancy fuse blocks for the first bank and the redundancy fuse blocks for the second bank may repair a column of the first or second memory cells including the defective cell with a column of redundancy cells including the first and second corresponding redundancy cells.

According to some other inventive principles of this patent disclosure, a method may include: interposing a decoder between first and second banks of a memory device; arranging redundancy fuse blocks for the first bank to repair a defective memory cell of the first bank with a first corresponding redundancy cell, in the decoder; and alternately arranging redundancy fuse blocks for the second bank to repair a defective memory cell of the second bank with a second corresponding redundancy cell, between the redundancy fuse blocks for the first bank in the decoder.

In one embodiment, the decoder is a row decoder to address rows of the first and second banks; the redundancy fuse block for the first bank is to repair a defective row of the first bank with a corresponding redundancy row; and the redundancy fuse block for the second bank is to repair a defective row of the second bank with a corresponding redundancy row. In another embodiment, the decoder is a column decoder to address columns of the first and second banks; the redundancy fuse block for the first bank is to repair a defective column of the first bank with a corresponding redundancy column; and the redundancy fuse block for the second bank is to repair a defective column of the second bank with a corresponding redundancy column.

In another embodiment, the redundancy fuse blocks for the first bank and the redundancy fuse blocks for the second bank may be alternately arranged in a first direction of a wafer in which the memory device is integrated. The method may further include alternately arranging the redundancy fuse blocks for the first bank and the redundancy fuse blocks for the second banks in at least two rows. The method may further include repairing defective cells of the first bank and the second bank while moving a tester in the first direction.

According to some additional inventive principles of this patent disclosure, a memory device may include: a first bank of first memory cells; a second bank of second memory cells; a block of redundancy cells; and a decoder arranged between the first and second banks to access the first and second memory cells; wherein the decoder comprises a first redundancy fuse box to repair a defective one of the first memory cells with one of the redundancy cells, and a second redundancy fuse box to repair a defective one of the second memory cells with one of the redundancy cells; and wherein the first and second redundancy fuse boxes are arranged so that defective memory cells of the first bank and the second bank may be repaired by moving a tester in a first direction.

In some embodiments, the first and second redundancy fuse boxes may be arranged in a first line in the first direction. The decoder may further include: a third redundancy fuse box to repair a defective one of the first memory cells with one of the redundancy cells, and a fourth redundancy fuse box to repair a defective one of the second memory cells with one of the redundancy cells; wherein the third and fourth redundancy fuse boxes are arranged in the first line with the first and second redundancy fuse boxes.

In some embodiments, the first and second redundancy fuse boxes may be arranged alternately with the third and fourth redundancy fuse boxes. The decoder may further include a third redundancy fuse box to repair a defective one of the first memory cells with one of the redundancy cells, and a fourth redundancy fuse box to repair a defective one of the second memory cells with one of the redundancy cells; wherein the third and fourth redundancy fuse boxes are arranged in a second line in the first line, wherein the second line is displaced from the first line in a second direction.

In some embodiments, the memory device may have a stack bank structure in which at least two banks share a row decoder or a column decoder. Redundancy fuse block arrays for the two banks may be alternately arranged in an X-axis direction or a Y-axis direction of a wafer in the row decoder or the column decoder.

DETAILED DESCRIPTION

Figure 1:
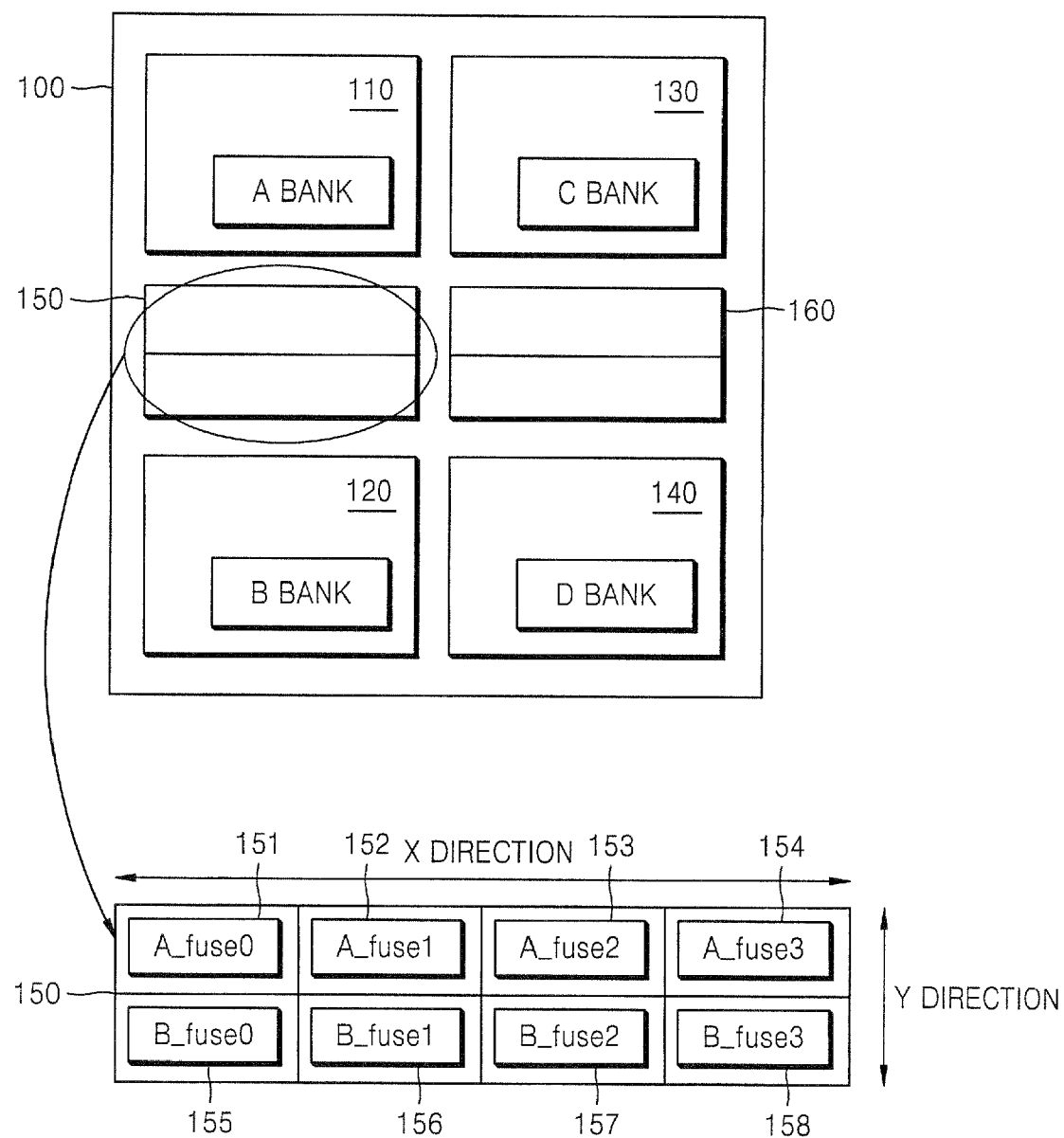
FIG. 1 is a block diagram of a conventional memory device including a plurality of redundancy fuse block arrays.

The inventive principles of this patent disclosure will now be described more fully with reference to the accompanying drawings, in which exemplary embodiments are shown. The inventive principles may, however, be embodied in many different forms and should not be construed as being limited to the embodiments set forth therein; rather, these embodiments are provided so that this disclosure will be thorough and complete, and will fully convey the inventive concepts to those skilled in the art. Like reference numerals in the drawings denote like elements, and thus their description will not be repeated.

Figure 2:
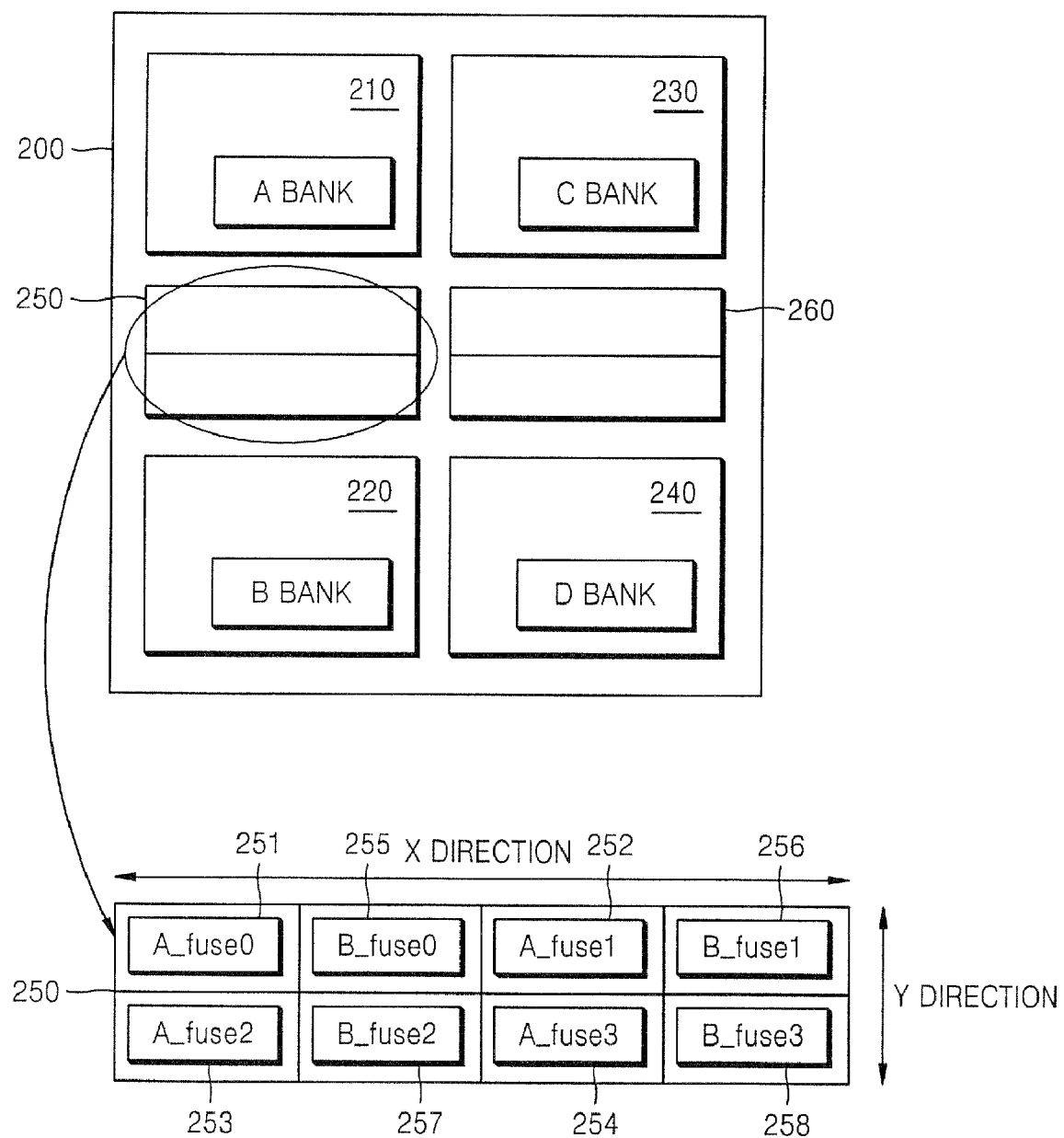
FIG. 2 is a block diagram of an embodiment of a memory device according to the inventive principles of this patent disclosure.

FIG. 2 is a block diagram of an embodiment of a memory device 200 according to the inventive principles of this patent disclosure. Referring to FIG. 2, the memory device 200 includes an A bank 210, a B bank 220, a C bank 230, and a D bank 240.

The A bank 210 and the B bank 220 have a stack bank structure for sharing a first row decoder 250. Alternatively, the A bank 210 and the B bank 220 may have a stack bank structure for sharing a column decoder (not shown). The A bank 210 and the B bank 220 address memory cells using the shared row decoder 250 or the column decoder. The C bank 230 and the D bank 240 also have a stack bank structure for sharing a second row decoder 260 or column decoder.

Redundancy fuse block arrays 251 through 258 for repairing defective rows of the A bank 210 and the B bank 220 with redundancy rows are arranged in the first row decoder 250. Alternatively, the redundancy fuse block arrays 251 through 258 may be used to repair defective columns of the A bank 210 and the B bank 220 with redundancy columns.

The redundancy fuse block arrays 251 through 254 for the A bank 210 and the redundancy fuse block arrays 255 through 258 for the B bank 220 are alternately arranged in the first row decoder 250. In other words, the first redundancy fuse block array 251 for the A bank 210, the first redundancy fuse block array 255 for the B bank 220, the second redundancy fuse block array 252 for the A bank 210, and the second redundancy fuse block array 256 for the B bank 220 are arranged adjacent to the A bank 210. The third redundancy fuse block array 254 for the A bank 210, the third redundancy fuse block array 257 for the B bank 220, the fourth redundancy fuse block array 254 for the A bank 210, and the fourth redundancy fuse block array 258 for the B bank 220 are arranged adjacent to the B bank 220.

Similarly, redundancy fuse block arrays for the C bank 230 and redundancy fuse block arrays for the D bank 240 are arranged alternately and adjacent to the C bank 230 and the D bank 240 in the second row decoder 260.

When the memory device 200 is tested to repair defective rows, a tester programs the first redundancy fuse block array 251 for the A bank 210 to replace defective rows of the A bank 210 with redundancy rows and programs the first redundancy fuse block array 255 for the B bank 220 to replace defective rows of the B bank 220 with redundancy rows while moving in a first direction, for example, an X-axis direction, of the memory device 200.

When defective rows found in the A bank 210 and the B bank 220 are few, the tester repairs the defective rows of the A bank 210 and the B bank 220 using only the first redundancy fuse block array 251 for the A bank 210 and the first redundancy fuse block array 255 for the B bank 220 while moving only in the X-axis direction of the memory device 200. Then, the tester terminates testing the A bank 210 and the B bank 220 for defects.

When many defective rows are found in the A bank 210 and the B bank 220, the tester repairs the defective rows of the A bank 210 and the B bank 220 by additionally using the second redundancy fuse block array 252 for the A bank 210 and the second redundancy fuse block array 256 for the B bank 220 while moving only in the X-axis direction of the memory deice 200. Then, the tester terminates testing the A bank 210 and the B bank 220.

As described above, the tester can repair all the defective rows of the A bank 210 and the B bank 220 in the memory device 200 while moving only in the X-axis direction, whereas it had to pass all the redundancy fuse block arrays 151 through 154 for the A bank 110 of FIG. 1 while moving in the X-axis direction of the memory device 100 to repair the defective rows of the A bank 110 in the conventional memory device 100, and then pass all the redundancy fuse block arrays 155 through 158 for the B bank 120 while moving in the Y-axis direction and then in the X-axis direction of the memory device 100 to repair the defective rows of the B bank 120 in the memory device 100. Therefore, the test time may be significantly reduced.

When even more defective rows are found in the A bank 210 and the B bank 220, the tester repairs the defective rows of the B bank 220 and the A bank 210 by additionally using the fourth redundancy fuse block array 258 for the B bank 220, the fourth redundancy fuse block array 254 for the A bank 210, the third redundancy fuse block array 257 for the B bank 220, and the third redundancy fuse block array 253 for the A bank 210 while moving in an Y-axis direction and then the X-axis direction of the memory device 200.

Since the number of defective rows found in the A bank 210 and the B bank 220 is usually small, the tester can usually repair defective rows of the A bank 210 and the B bank 220 while moving only in the X-axis direction. Since the tester need not shift from the X-axis direction to the Y-axis direction, the test time may be further reduced.

While the inventive principles of this patent disclosure have been particularly shown and described with reference to exemplary embodiments, it will be understood by those of ordinary skill in the art that various changes in form and details may be made therein without departing from the spirit and scope of the inventive principles as defined by the following claims. For example, redundancy fuse block arrays arranged in the first and second row decoders 250 and 260 have been described in the present embodiments. However, the first through fourth redundancy fuse block arrays 251 through 254 for the A bank 210 and the first through fourth redundancy fuse block arrays 255 through 258 for the B bank 220 can also be alternately arranged in the column decoder. In this case, the tester can repair defective columns of the A bank 210 and the B bank 220 while moving in the Y-axis direction.

The invention claimed is:

1. A memory device comprising:
   a first bank comprising first rows and first columns of a plurality of first memory cells;
   a second bank comprising second rows and second columns of a plurality of second memory cells;
   a redundancy cell block in which a plurality of redundancy cells are arranged;
   a decoder shared by the first and second banks to address the first and second memory cells;
   redundancy fuse blocks for the first bank included in the decoder to repair a defective one of the first memory cells with a first corresponding redundancy cell; and
   redundancy fuse blocks for the second bank included in the decoder and repair a defective one of the second memory cells with a second corresponding redundancy cell;
   wherein the redundancy fuse blocks for the first bank and the redundancy fuse blocks for the second bank are alternately arranged in the decoder.

2. The memory device of claim 1, wherein the decoder comprises a row decoder to address the first and second rows.

3. The memory device of claim 1, wherein the decoder comprises a column decoder to address the first and second columns.

4. The memory device of claim 1, wherein the redundancy fuse blocks for the first bank and the redundancy fuse blocks for the second bank are alternately arranged in a first direction of a wafer in which the memory device is integrated.

5. The memory device of claim 4, wherein the first direction is an X direction of the wafer.

6. The memory device of claim 4, wherein redundancy fuse blocks for the first bank and the redundancy fuse blocks for the second banks are alternately arranged in at least two rows.

7. The memory device of claim 1, wherein the redundancy fuse blocks for the first bank and the redundancy fuse blocks for the second bank may repair a row of the first or second memory cells including the defective cell with a row of redundancy cells including the first and second corresponding redundancy cells.

8. The memory device of claim 1 wherein the redundancy fuse blocks for the first bank and the redundancy fuse blocks for the second bank may repair a column of the first or second memory cells including the defective cell with a column of redundancy cells including the first and second corresponding redundancy cells.

9. A method comprising:
   interposing a decoder between first and second banks of a memory device;
   arranging redundancy fuse blocks for the first bank to repair a defective memory cell of the first bank with a first corresponding redundancy cell, in the decoder; and
   alternately arranging redundancy fuse blocks for the second bank to repair a defective memory cell of the second bank with a second corresponding redundancy cell, between the redundancy fuse blocks for the first bank in the decoder.

10. The method of claim 9, wherein:
the decoder is a row decoder to address rows of the first and second banks;
the redundancy fuse block for the first bank is to repair a defective row of the first bank with a corresponding redundancy row; and
the redundancy fuse block for the second bank is to repair a defective row of the second bank with a corresponding redundancy row.

11. The method of claim 9, wherein:
the decoder is a column decoder to address columns of the first and second banks;
the redundancy fuse block for the first bank is to repair a defective column of the first bank with a corresponding redundancy column; and
the redundancy fuse block for the second bank is to repair a defective column of the second bank with a corresponding redundancy column.

12. The method of claim 9, wherein the redundancy fuse blocks for the first bank and the redundancy fuse blocks for the second bank are alternately arranged in a first direction of a wafer in which the memory device is integrated.

13. The method of claim 12, further comprising alternately arranging the redundancy fuse blocks for the first bank and the redundancy fuse blocks for the second banks in at least two rows.

14. The method of claim 12, further comprising repairing defective cells of the first bank and the second bank while moving a tester in the first direction.

15. A memory device comprising:
a first bank of first memory cells;
a second bank of second memory cells;
a block of redundancy cells; and
a decoder arranged between the first and second banks to access the first and second memory cells;
wherein the decoder comprises a first redundancy fuse box to repair a defective one of the first memory cells with one of the redundancy cells, and a second redundancy fuse box to repair a defective one of the second memory cells with one of the redundancy cells; and
wherein the first and second redundancy fuse boxes are arranged so that defective memory cells of the first bank and the second bank may be repaired by moving a tester in a first direction.

16. The memory device of claim 15, wherein the first and second redundancy fuse boxes are arranged in a first line in the first direction.

17. The memory device of claim 16, wherein:
the decoder further comprises a third redundancy fuse box to repair a defective one of the first memory cells with one of the redundancy cells, and a fourth redundancy fuse box to repair a defective one of the second memory cells with one of the redundancy cells; and
the third and fourth redundancy fuse boxes are arranged in the first line with the first and second redundancy fuse boxes.

18. The memory device of claim 17, wherein the first and second redundancy fuse boxes are arranged alternately with the third and fourth redundancy fuse boxes.

19. The memory device of claim 18, wherein:
the decoder further comprises a third redundancy fuse box to repair a defective one of the first memory cells with one of the redundancy cells, and a fourth redundancy fuse box to repair a defective one of the second memory cells with one of the redundancy cells; and
the third and fourth redundancy fuse boxes are arranged in a second line in the first line, wherein the second line is displaced from the first line in a second direction.

20. The memory device of claim 15, wherein the decoder may comprise a row decoder or a column decoder.

* * * * *